United States Patent [19]

Yokota

[11] Patent Number: 5,658,165

[45] Date of Patent: Aug. 19, 1997

[54] ELECTRIC CONNECTION STRUCTURE BETWEEN ELECTRIC PARTS AND FLEXIBLE WIRING PLATE

[75] Inventor: Hiroyuki Yokota, Shizuoka, Japan

[73] Assignee: Yazaki Corporation, Tokyo, Japan

[21] Appl. No.: 575,026

[22] Filed: Dec. 19, 1995

[30] Foreign Application Priority Data

Dec. 26, 1994 [JP] Japan ................................ 6-322588

[51] Int. Cl.⁶ ........................................................ H01R 9/07
[52] U.S. Cl. ............................ 439/495; 439/660; 439/77
[58] Field of Search ................................ 439/495, 67, 77, 439/660, 289, 594

[56] References Cited

U.S. PATENT DOCUMENTS

| 3,370,265 | 2/1968 | Berg .................................... 439/843 |
| 3,699,495 | 10/1972 | Raynor ................................ 439/77 |
| 3,915,544 | 10/1975 | Yurtin ................................. 439/77 |
| 4,374,603 | 2/1983 | Fukunaga et al. ...................... 439/77 |
| 4,560,231 | 12/1985 | Shirai ................................ 439/843 |
| 4,640,561 | 2/1987 | George .............................. 439/77 |
| 4,648,673 | 3/1987 | Endo et al. ............................ 439/395 |
| 4,737,118 | 4/1988 | Lockard ............................... 439/660 |
| 5,158,485 | 10/1992 | Saito et al. ............................ 439/843 |
| 5,217,382 | 6/1993 | Sparks et al. ......................... 439/161 |
| 5,226,842 | 7/1993 | Endo et al. ............................ 439/843 |

FOREIGN PATENT DOCUMENTS 5984773  6/1994  Japan .

Primary Examiner—David L. Pirlot
Assistant Examiner—Tho D. Ta
Attorney, Agent, or Firm—Sughrue, Mion, Zinn, Macpeak & Seas

[57] ABSTRACT

An electric connection structure is provided for electrically connecting an automobile instrument, such as a speedometer or tachometer, and a flexible wiring plate disposed on a body casing. A male connector, which houses terminals connected to the coils, is provided on the inner mechanism side. A female connector, which accommodates a strip portion of the flexible wiring plate having a conduction portion, is provided on the side of the body casing having the flexible wiring plate at the rear surface thereof. A wiring plate pressing member for pressing and retaining the strip portion is inserted in the female connector from the rear surface side of the meter casing. When the male and female connectors are engaged, the terminals directly contact the conduction portion of the flexible wiring plate.

12 Claims, 5 Drawing Sheets

ELECTRIC CONNECTION STRUCTURE BETWEEN ELECTRIC PARTS AND FLEXIBLE WIRING PLATE

BACKGROUND OF THE INVENTION

1. Field of the Invention

This invention relates to an electric connection structure for electrically connecting electric parts and a flexible wiring plate disposed at a body casing side to which the electric parts are mounted, wherein the electric parts include a bobbin having coils wound therearound and a magnet rotatably supported within the bobbin.

2. Background

Conventionally, a cross coil type meter used as a speed meter or a tachometer for an automobile, for example, has been provided as one kind of each electric parts. FIG. 8 shows the configuration of the cross coil type meter in which an inner mechanism 1 is mounted on a meter casing 3. FIG. 9 shows a perspective view of the inner mechanism 1. A flexible wiring plate 4 is mounted on the lower surface of the meter casing 3 so that a driving signal inputted through the flexible wiring plate 4 is supplied to the inner mechanism 1 to thereby operate the inner mechanism 1.

In the inner mechanism 1, a pair of coils 7, 9 are wound around a bobbin 5 so as to cross to each other. A magnet 13 fixed to a pointer shaft 11 is rotatably housed within the bobbin 5. A pointer 15 is attached to a tip end (top end) of the pointer shaft 11. The pointer 15 rotates with the rotation of the magnet 13 which rotates by an angle corresponding to a difference between magnetic flux generated by the coil 7 and that generated by the coil 9 to thereby points a scale on a dial plate 17.

The bobbin 5 having the coils 7, 9 wound therearound is housed within and fixed to an electro-magnetic shield casing 19 whose upper portion is opened. The dial plate 17 is fixed through screws etc. to a pair of boss portions 5a which are provided at the right and left sides of the bobbin 5 and protrude from the upper portion of the electro-magnetic shielding casing 19. A pair of terminal fixing portions 5b protrude downward from the pair of boss portions 5a and are positioned at the opposite sides of the electro-magnetic shielding casing 19, respectively. Two pin terminals 21 are attached to each of the terminal fixing portions in a manner that these pin terminals protrude downward therefrom. That is, the two pin terminals 21 are provided at each of the left and right terminal fixing portions and hence four pin terminal portions are provided in total. Four terminals of the two coils 7 and 9 are connected to the end portions of the four pin terminals 21 at the terminal fixing portion 5b sides, respectively.

Four through holes 23 are formed in the meter casing 3 in correspondence with the four pin terminals 21, respectively. Each of the pin terminals 21 is inserted into a corresponding one of the through holes 23, and further each of contact members 25 is inserted into a corresponding one of the through holes from the flexible wiring plate 4 side and fixed thereto so as to perform electrical conduction between the pin terminals and the flexible wiring plate. The contact members 25 are inserted into the through holes 23 from the lower side in the drawing such that the contact members catch conduct portions 27 connected to a wiring pattern of the flexible wiring plate 4 into the through holes, so that the conduct portions 27 are sandwiched between the inner walls of the through holes 23 and the contact members 25. Each of the contact members 25 is provided with contact portions 25a protruding to the conducting portion 27 sides and is also provided with engagement pawls 25b for preventing the contact member from getting out of the through hole 23 downward.

When the pin terminals 21 are inserted into the contact portions 25 of the body casing 3 side, the inner mechanism 1 thus configured can be electrically connected to the flexible wiring plate 4 and mechanically fixed to the body casing 3. The dial plate 17 to which the upper side of the inner mechanism 1 is fixed to the body casing 3 through screws etc.

According to the aforesaid conventional electric connection structure, there is provided some play or tolerance between each of the pin terminals 21 of the inner mechanism 1 and the associated one of the contact members 25 of the body casing 3 sides by taking into consideration that there are some positional deviations between each of the pin terminals 21 and the associated one of the contact members 25. However, the aforesaid conventional electric connection structure has problems that the inserting procedure of the pin terminals 21 is troublesome since the number of the pin terminals to be inserted is four, and that, upon performing the inserting procedure under a condition that the dial plate 17 is mounted to the inner mechanism 1, the efficiency of the inserting procedure is quite low since it is difficult to see the insertion portion directly and hence the pin terminals are difficult to position with respect to the contact portions.

The pin terminals 21 are electrically connected with the conducting portion 27 of the flexible wiring plate 4 not directly but through the contact members 25, so that there arises a problem that the reliability of the electrical connection therebetween is not sufficient. Further, since the four contact members 25 are required and these four contact members 25 are required to be inserted into the through holes 23 of the body casing 3, there arises a problem that the number of the parts are increased and so the assembling workability is degraded and the cost of the meter is increased.

SUMMARY OF THE INVENTION

The present invention has been made in order to overcome the above problems and drawbacks, and an object of the present invention is to provide an electric connection structure which is able to improve the workability of mounting electric parts to a body casing such that the electric conduction is performed between the electric parts and the body casing, and to maintain the electric conduction state therebetween well to thereby improve the reliability of the electric connection structure.

In order to achieve the aforesaid object, firstly, according to the present invention, in an electric connection structure for electrically connecting electric parts and a flexible wiring plate disposed at a body casing side to which the electric parts are mounted, wherein the electric parts include a bobbin having coils wound therearound and a magnet rotatably supported within the bobbin, the electric connection structure comprises a parts side fitting unit in which terminals electrically connected to the coils are housed on the electric parts side, and a casing side fitting unit for housing a strip portion of the flexible wiring plate is on the body casing side, wherein the casing side fitting unit is capable of fitting with the parts side fitting unit and capable of making a conductive portion of the strip portion electrically conductive with the terminals of the electric parts side in the fitting state with the parts side fitting unit, and wherein one of the casing side fitting unit and the parts side fitting unit corresponds to a housing for a male connector and the other corresponds to a housing for a female connector.

Secondly, in the first configuration, the electric parts are a cross coil type meter in which the two coils are wound around the bobbin so as to cross to each other and a pointer fixed to a rotation shaft of a magnet, which indicates a value corresponding to a rotation angle of the magnet which rotates by an angle corresponding to a difference between magnetic fluxes generated by the respective coils, and wherein the parts side fitting unit corresponds to the housing for the male connector which is formed by resin and integrally formed with the bobbin, and the casing side fitting unit corresponds to the housing for the female connector which is formed by resin and integrally formed with the body casing.

Thirdly, in the second configuration, an engagement projection is provided at one of the housing for the male connector and the housing for the female connector and an engagement hole capable of engaging with the engagement projection is formed at the other of the housings for the male and female connectors.

Fourthly, in the second configuration, the housing for the male connector is provided with insertion holes in which the terminals are inserted and fixed, and each of the terminals is provided at its one end with a connection portion to which a terminal of the coil is connected and provided at its other end with an elastic portion for elastically pressing the conductive portion of the strip portion of the flexible wiring plate.

Fifthly, in the second configuration, the housing for the female connector is formed on a surface side of the body casing to which the male connector is fitted and a through hole communicating with a fitting hole of the housing for said female connector is provided in the body casing, and the flexible wiring plate is provided on a surface side of the body casing opposite to the surface side on which the male connector is fitted and the strip portion is drawn out through the through hole under a condition that the conductive portion of the strip portion is exposed to the inner surface side of the fitting hole.

Sixthly, in the fifth configuration, a wiring plate pressing unit for pressing the strip portion of the flexible wiring plate to the inner wall of the fitting hole is inserted into the fitting hole.

According to the first configuration of the present invention, the terminals of the electric parts side are made electrically conductive with the conduction portion of the flexible wiring plate of the body casing side by fitting the parts side fitting unit and the casing side fitting unit to each other. Since the parts side fitting unit and the casing side fitting unit correspond to one and the other of the housings of the male connector and the female connector, respectively, the fitting procedure can be performed easily. Further, since the terminals of the electric parts directly contact to the conduction portion of the flexible wiring plate, the electric conduction state therebetween can be maintained well and the reliability of the electric connection structure is improved.

According to the second configuration of the present invention, the housing for the male connector of the cross coil type meter is formed integrally with the bobbin around which the coils are wound, and further the housing for the female connector of the body casing side is formed integrally with the body casing, so that the number of parts of the electric connection structure can be decreased.

According to the third configuration of the present invention, at the time of mounting the cross coil type meter to the body casing so as to realize the electrical conduction for the flexible wiring plate, the housings for the male and female connectors are mutually fixed by fitting the engagement projection into the engagement hole.

According to the fourth configuration of the present invention, the terminals inserted into the housing for the male connector are maintained in a good conduction state as to the conduction portion of the flexible wiring plate by the elastic portion.

According to the fifth configuration of the present invention, since the strip portion of the flexible wiring plate whose conduction portion is exposed is drawn into the inner surface of the fitting hole of the housing for the female connector, the terminals can be easily made to contact the conduction portion by inserting the male connector into the fitting hole.

According to the sixth configuration of the present invention, the strip portion of the flexible wiring plate can be fixed within the fitting hole of the housing for the female connector by the wiring plate pressing member.

DETAILED DESCRIPTION OF THE PREFERRED EMBODIMENTS

The embodiments of the present invention will be described with reference to the accompanying drawings.

Figure 1:
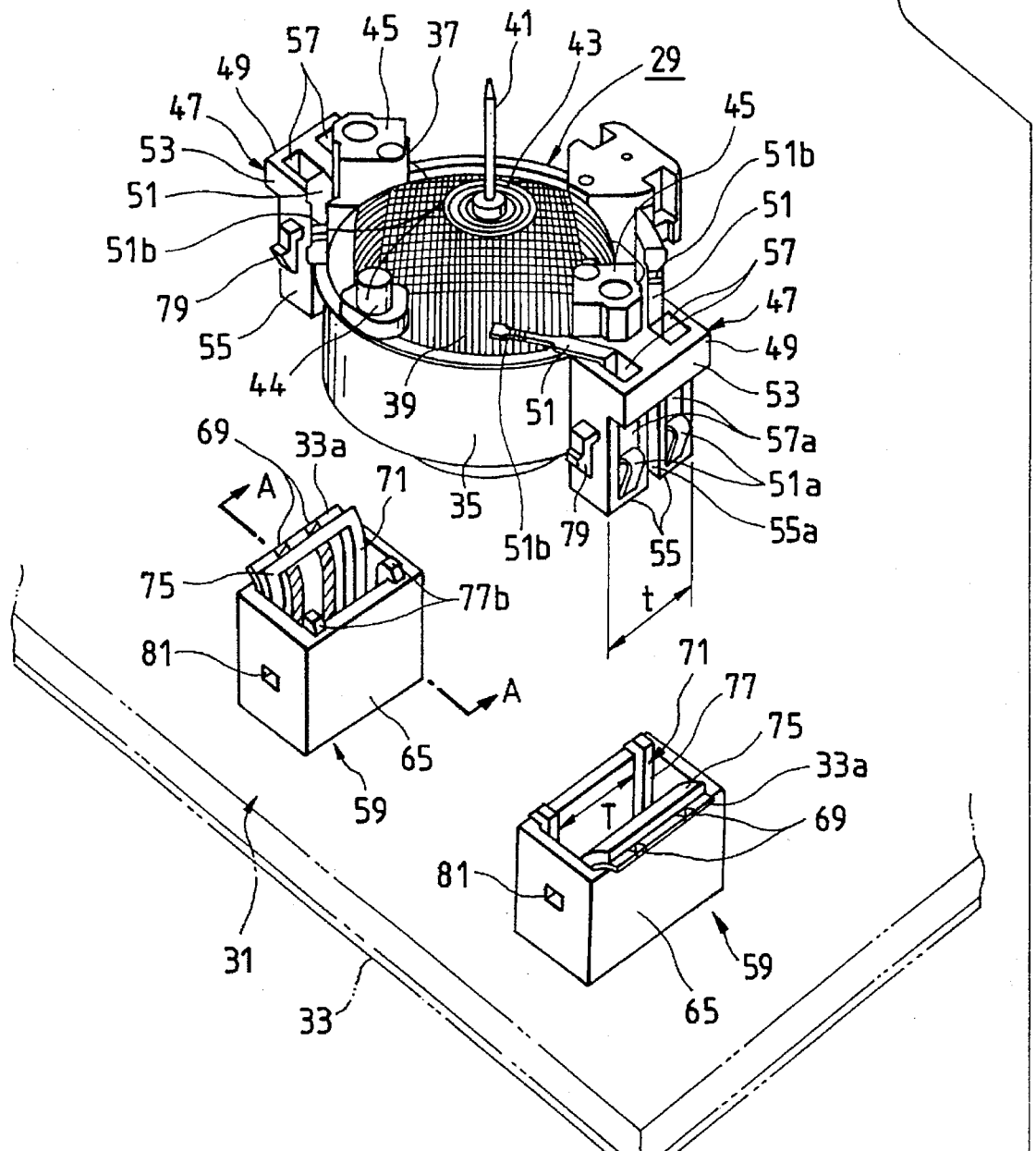
FIG. 1 is a perspective view showing an electric connection structure between electric parts and a flexible wiring plate according to an embodiment of the present invention.

FIG. 1 is a perspective view of an electric connection structure for electrically connecting electric parts and a flexible wiring plate according to a first embodiment of the present invention. The electric parts, that is, an inner mechanism 29 of a cross coil type meter is fixed to a body casing, that is, a meter casing 31. In this state, the electric parts are electrically connected to a flexible wiring plate 33 which is mounted to the rear surface of the meter casing 31. Thus, a driving signal introduced through the flexible wiring plate 33 is supplied to the inner mechanism 29 to thereby drive the inner mechanism 29.

Like the conventional ones, the inner mechanism 29 is configured in a manner that a pair of coils 39 are wound so as to cross to each other around a bobbin 37 fixed within an electro-magnetic shielding casing 35, and that a not-shown magnet is fixed to a pointer shaft 41 serving as a rotary shaft rotatable with respect to the bobbin 37, and the magnet is housed within the bobbin 37 as a rotor. Like the conventional ones, a not-shown pointer is attached to the tip (top) end of the pointer shaft 41 so that the pointer rotates with the rotation of the magnet which rotates by an angle corresponding to a difference between magnetic fluxes generated by the pair of coils 39 to thereby point on a scale on a dial plate. One end of a return spring 43 is attached to the pointer shaft 41 so as to return the pointer shaft such that the pointer points zero when the pointer shaft 41 is not supplied with a rotation power by the magnetic field generated by the coils 39. The other end of the return spring 43 is attached to an attachment portion 44 which is formed as a unit with the bobbin 37.

Figure 2:
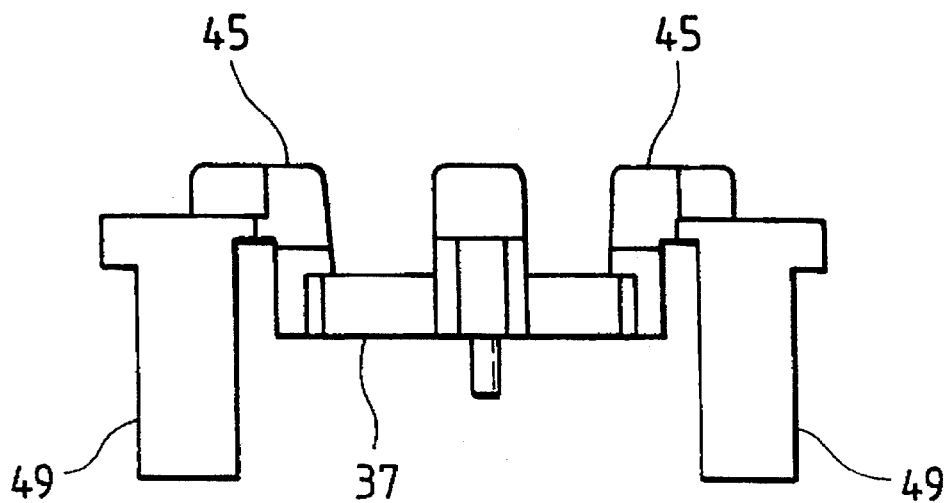
FIG. 2 is a side view showing a bobbin housed in an inner mechanism in FIG. 1.

The bobbin 37 is provided with a pair of boss portions 45 protruding from the upper portion of the electro-magnetic shielding casing 35 and the dial plate is fixed to the boss portions 45 through screws etc. Each of the pair of boss portions 45 are provided with a male connector 47 which protrudes downward and is positioned at the side portion of the electro-magnetic shielding casing 35. The male connector 47 is formed by a housing 49 serving as a parts side fitting unit and a pair of terminals 51 fitted into the housing 49. Both the housings 49 and the boss portions 45 are molded by resin integrally with the bobbin 37 as shown in FIG. 2.

The pair of housings 49 are provided with insertion portions 55 protruding downward from base portions 53 and are further provided with terminal holes 57 for inserting the terminals 51 therein from the upper surfaces of the base portions 53 in correspondence with the insertion portions 55. The terminal holes 57 are provided with opening portions 57a at the side surfaces of the insertion portions 55. Elastic portions 51a of the terminals 51 are inserted into the terminal holes 57 from the base portion 53 sides and protrude and are exposed from the opening portions 57a. The upper ends of the four terminals 51 opposite to the elastic portions 51a are bent to the coil 39 sides to form coil winding portions 51b around which the four terminals of the two coils 39 are wound, respectively.

Figure 3:
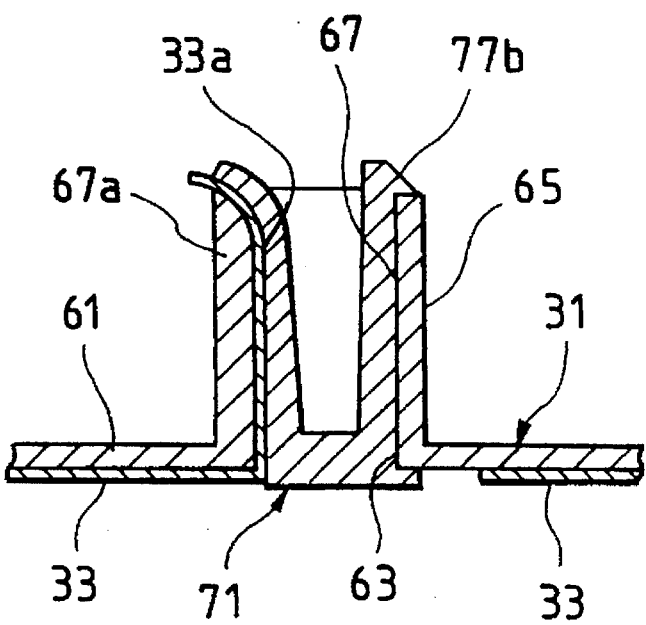
FIG. 3 is a sectional view taken along a line A—A in FIG. 1.

The meter casing 31 is provided with female connectors 59 on the inner surface side thereof on which the inner mechanism 29 is mounted such that the male connectors 47 of the inner mechanism 29 side are inserted into the female connectors. As shown in FIG. 3 which is a cross sectional view of FIG. 1 taken along a line A—A, each of the female connectors 59 is provided with a through hole 63 in a bottom plate 61, and are also provided with a housing 65 serving as a casing side fitting unit molded integrally with the bottom plate such that the housing has side walls on all sides protruding upward from the periphery of the through hole 63.

The housing 65 has a fitting hole 67 communicated with the through hole 63. A strip portion 33a of the flexible wiring plate 33 is drawn into the fitting hole 67 from the lower side in FIG. 3. The strip portion 33a is provided with a pair of conductive portions 69 toward which the elastic portions 51a of the terminal 21 of the inner mechanism 29 side are pressed and made contact thereto. A wiring plate pressing member 71 is inserted within the fitting hole 67 from the lower side in FIG. 3 and fixed thereto so that the wiring plate pressing member presses the strip portion 33a to one side wall 67a of the fitting hole 67 under a condition that the strip portion 33a of the flexible wiring plate 33 is drawn into the fitting hole 67.

Figure 4:
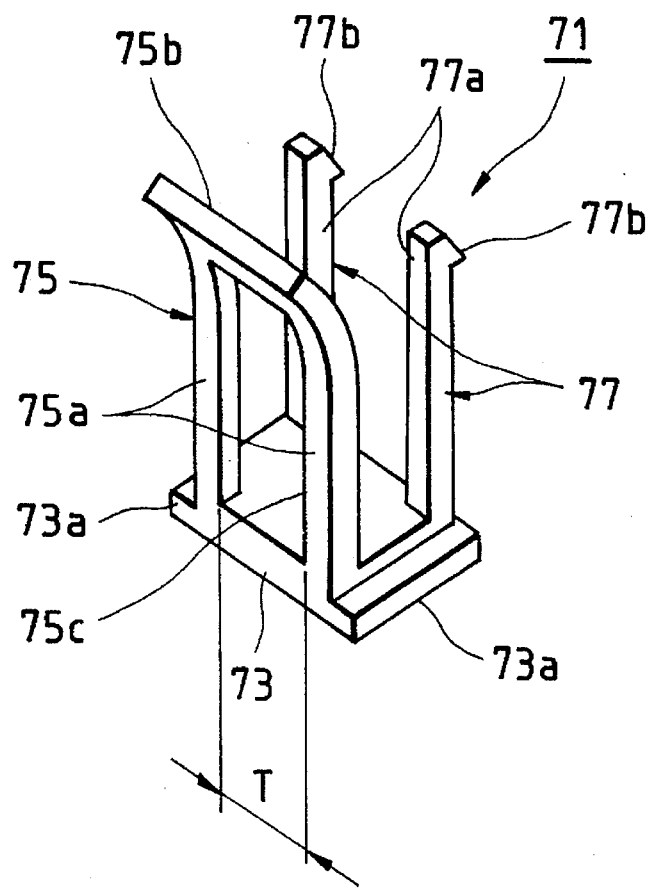
FIG. 4 is a perspective view showing a wiring plate pressing member of a female connector side in FIG. 1.

The wiring plate pressing member 71 is formed by a bottom portion 73 covering the through hole 63 and a pressing portion 75 and a fixing portion 77 erected from the bottom portion 73, as shown by a perspective view thereof in FIG. 4. The pressing portion 75 is formed by two leg portions 75a and a connecting portion 75b which connects the tip ends of the two leg portions 75a to thereby form in a frame shape having an opening portion 75c at the center portion so that the pressing portion presses the strip portion 33a of the flexible wiring plate 33 to the one side wall 67a of the fitting hole 67.

Figure 5:
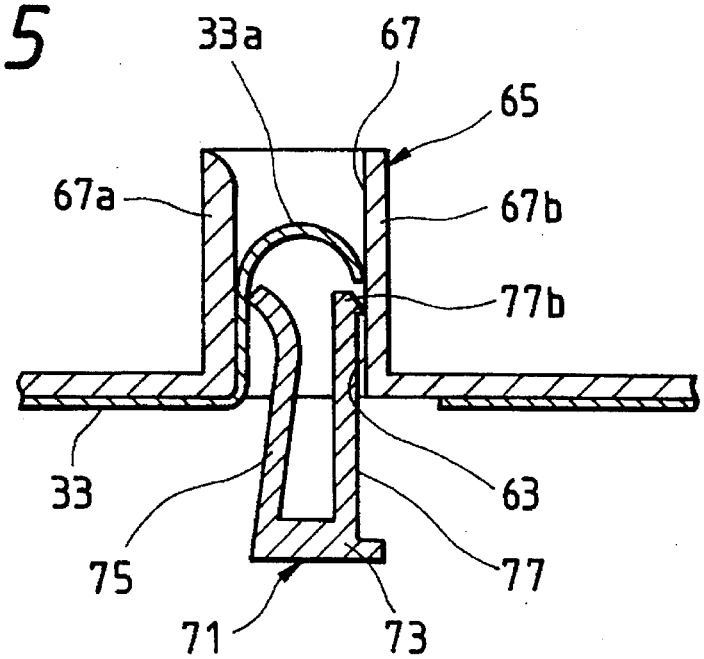
FIG. 5 is a diagram used for explaining the operation at the time of inserting the wiring plate pressing member of FIG. 4 into a fitting hole.

The portion from the tip portions of the two leg portions 75a to the connecting portion 75b is configured such that it is protrudes upward from the upper opening of the fitting hole 67 and bent outward in a curved shape under a condition that the wiring plate pressing member 71 is inserted into the fitting hole 67. The tip portion of the side wall 67a is formed in a curved shape so as to cope with this curved surface of the pressing portion 75, as shown in FIG. 5. The fixing portion 77 is formed in a manner that, under a condition that the wiring plate pressing member 71 is inserted into the fitting hole 67, tip portions of two leg portions 77a protrude outward from the upper opening of the fitting hole 67 and engagement pawls 77b for engaging with the top end edge of the other side wall 67b of the fitting hole 67 are formed at the protruded end portions of the leg portions 77a.

The width of the opening portion 75c of the pressing portion 75, that is, the size T between the both leg portions 75a is set to be substantially same as a size between the both leg portions 77a of the fixing potion 77 and slightly larger than a size t of the width of the housing 49 of the male connector 47 of the inner mechanism 29 side. Accordingly, under a condition that the male connector 47 of the inner mechanism 29 side is fitted into the female connector 59 of the meter casing 31 side, the insertion portions 55 of the male connector 47 are placed between the both leg portions 75a of the pressing portion 75 and also between the both leg portions 77a of the fixing portion 77, so that the housing 49 contacts to the both side walls 67a and 67b of the housing 65 in this state.

A slit 55a is formed at one side of the insertion portion 55 of each of the pair of the male connectors 47. A projection is formed at the inner surface of the housing 65 of the female connector 59 in which the insertion portion 55 having the slit 55a is inserted so that the slit engages with the projection, whereby it becomes possible to fit the pair of the male connectors 47 with the pair of the female connectors 59 with the correct directional arrangement, respectively.

At the time of inserting the wiring plate pressing member 71 into the fitting hole 67, the wiring plate pressing member 71 is inserted from the lower side of the fitting hole 67 such that the wiring plate pressing member 71 pushes the strip portion 33a of the flexible wiring plate 33 as shown in FIG. 5. After the insertion, when the engagement pawls 77b engage with the top end edge of the other side wall 67b within the fitting hole 67, flange portions 73a of the wiring plate pressing member protruding to the side direction from the bottom portion 73 contact the rear surface of the meter casing 31 to thereby prevent the wiring plate pressing member from getting out of the fitting hole.

A locking arm having an engagement projection 79 at its free end is formed at each of the both side portions of the housing 49 of the male connector 47. An engagement hole 81 capable of engaging with the engagement projection 79 is formed at each of the both side portions of the housing 65 of the female connector 59 so as to penetrate the side portion. Alternatively, the locking arm having the engagement projection 79 may be formed at the housing 65 of the female connector 59 and the engagement hole 81 may be formed at the housing 49 of the male connector 47.

At the time of mounting the aforesaid inner mechanism 29 to the casing 31, the male connectors 47 integrated with the bobbin 37 are inserted into the fitting hole 67 of the female connector 59 of the meter casing 31. In this case, since the strip portion 33a of the flexible wiring plate 33 is bent and pressed outward by the connection portion 75b being bent outward of the pressing portion 75 of the wiring plate pressing member 71, the male connector can be inserted smoothly into the fitting hole without being interfered by the tip end of the strip portion 33a. In the inserted state, the elastic portions 51a of the terminals 51 are pressed to and contact with the conductive portions 69 of the strip portion 33a, so that the electrical connection can be surely performed between the inner mechanism 29 side and the meter casing 31 side to thereby provide the electric connection structure with high reliability. Further, at this time, since the engagement projections 79 of the male connector 47 side are fitted into the engagement holes 81 of the female connector 59 side, they are locked and fixed to each other.

In this manner, since the inner mechanism 29 is fixed to the meter casing 31 through connectors at two portions, the fixing procedure is easy as compared with that of the conventional electric connection structure in which the four pin terminals provided at the inner mechanism side are inserted into the respective contact members of the meter casing side. Further, at the time of fixing the inner mechanism 29 to the meter casing 31 with the dial plate attached to the inner mechanism, the fixing or connection procedure can be performed surely and hence the efficiency of the connection procedure can be improved. Since the female connector 59 of the meter casing 31 is configured in a manner that the wiring plate pressing member 71 for pressing the strip portion 33a of the flexible wiring plate 33 is inserted within the housing 65, the number of parts can be made smaller and connecting procedure can be improved to thereby attain a reduction of cost when compared with the conventional electric connection structure in which the four contact members are inserted in the meter casing in correspondence with the four pin terminals of the inner mechanism side.

Figure 6:
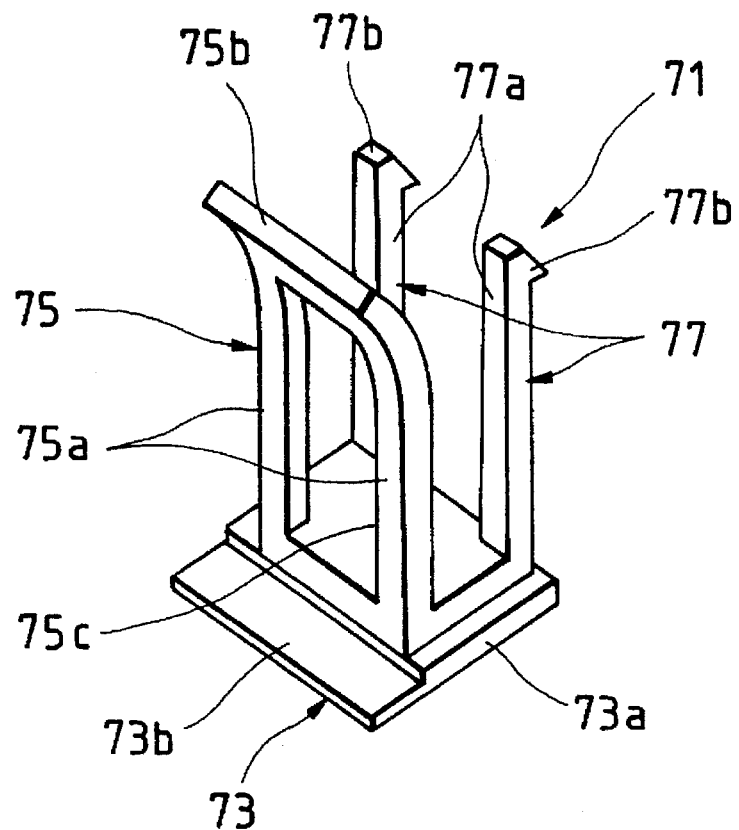
FIG. 6 is a perspective view showing another example of the wiring plate pressing member.

FIG. 6 shows another example of the wiring plate pressing member 71, in which portions identical to those of FIG. 4 are referred to by the common symbols. The wiring plate pressing member 71 of FIG. 6 is further provided with an extended portion 73b at the pressing portion 75 side of the bottom portion 73 as compared with the wiring plate pressing member of FIG. 4.

Figure 7:
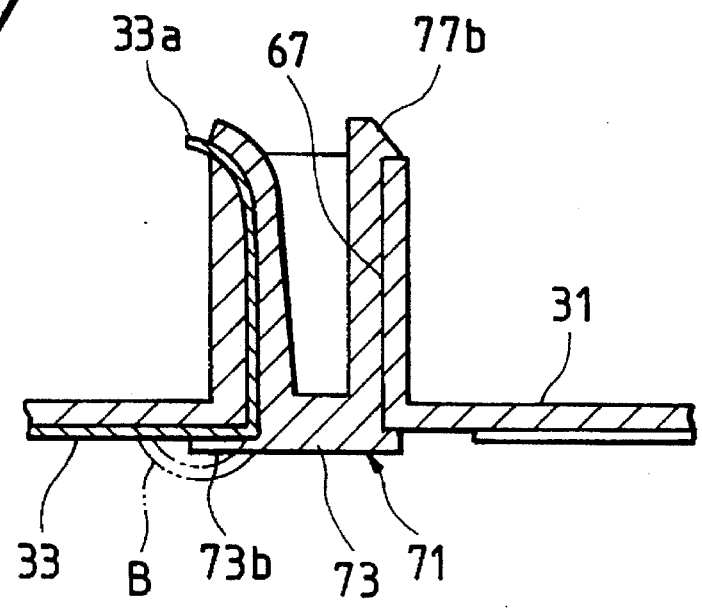
FIG. 7 is a sectional view showing a state where the wiring plate pressing member of FIG. 6 is inserted into the fitting hole.
Figure 8:
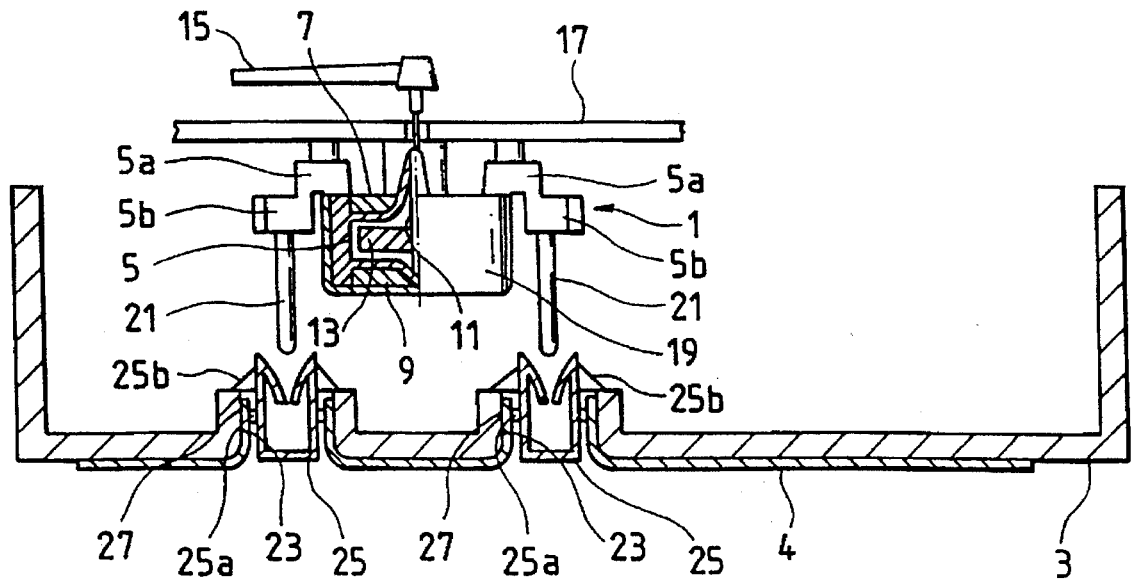
FIG. 8 is a sectional view showing the structure of the conventional cross coil type meter for mounting an inner mechanism to a meter casing.
Figure 9:
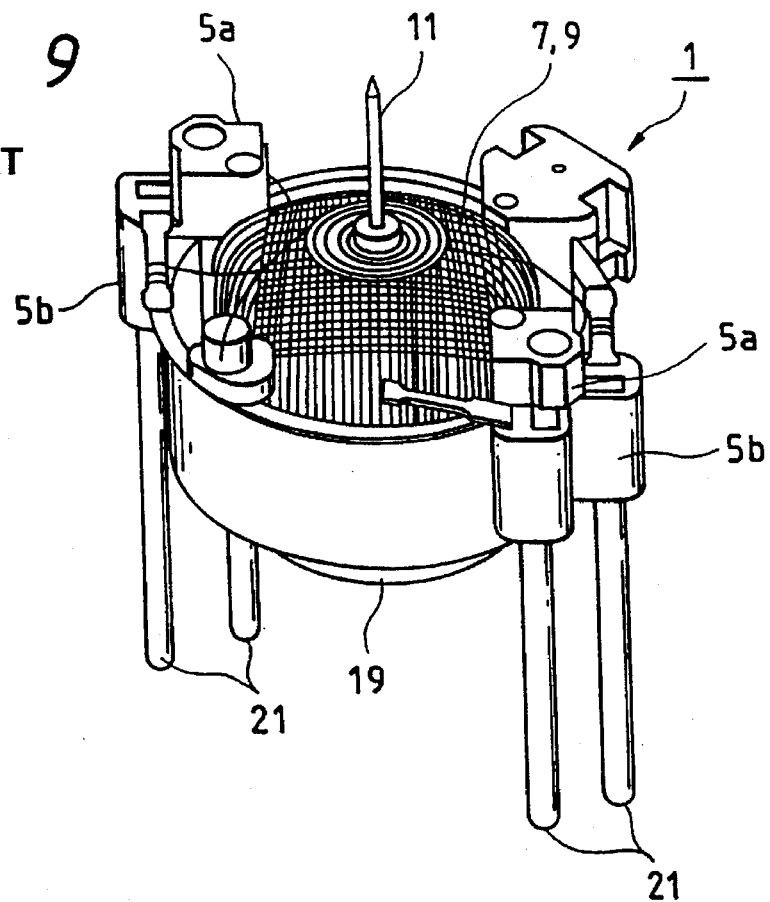
FIG. 9 is a perspective view showing the inner mechanism of FIG. 8.

The extended portion 73b sandwiches the flexible wiring plate 33 between the extended portion 73b and the meter casing 31 under a condition that the wiring plate pressing member 71 is inserted and fixed within the fitting hole 67. Accordingly, at the time of inserting the male connector 47 into the fitting hole 67 of the female connector 59, even when the contact pressure of the elastic portions 51a of the terminals 51 is large due to the variations of the accuracy of the parts (including variations of spring force), the strip portion 33a of the flexible wiring plate 33 is prevented from moving downward and hence the loosening of the flexible wiring plate 33 shown by a two-dot chain line B in FIG. 7 can be prevented.

As described above, according to the first aspect of the invention, since the terminals of the electric parts sides are made electrically conductive with the conduction portion of the flexible wiring plate by mutually fitting the parts side fitting unit and the casing side fitting unit which correspond to one and the other of housings for the male connector and the female connector, respectively, the electric parts can be easily connected to the flexible wiring plate of the body casing side. Further, since the terminals of the electric parts directly contact the conduction portion of the flexible wiring plate, the electric conduction state therebetween can be maintained well and the reliability of the electric connection structure is improved.

According to the second aspect of the invention, the housing for the male connector of the cross coil type meter is formed integrally with the bobbin around which the coils are wound, and further the housing for the female connector of the body casing side is formed integrally with the body casing, so that the number of parts of the electric connection structure can be decreased.

According to the third aspect of the invention, at the time of mounting the cross coil type meter to the body casing so as to realize the electrical conduction for the flexible wiring plate, the housings for the male and female connectors can be mutually fixed by fitting the engagement projection into the engagement hole.

According to the fourth aspect of the invention, since the terminals inserted into the housing for the male connector are pressed and contact the conduction portion of the flexible wiring plate by the elastic portion, the terminals are maintained in a good conduction state with the flexible wiring plate.

According to the fifth aspect of the invention, since the strip portion of the flexible wiring plate whose conduction portion is exposed is drawn into the inner surface of the fitting hole of the housing for the female connector, the terminals can be easily made to contact the conduction portion by inserting the housing for the male connector of the electric parts side into the fitting hole.

According to the sixth aspect of the invention, since the strip portion of the flexible wiring plate is pressed to the inner wall within the fitting hole by the wiring plate pressing member, the strip portion can be prevented from falling out of the fitting hole.

What is claimed is:

1. An electric connection structure, comprising:
   a plurality of electric parts including a bobbin having coils wound therearound and a magnet rotatably supported within the bobbin;
   a body casing;
   a flexible wiring plate disposed at said body casing;
   a parts-side fitting unit attached to said bobbin, said parts-side fitting unit accommodating a plurality of terminals electrically connected to said coils; and
   a casing-side fitting unit, directly engageable with said parts-side fitting unit for securely mounting said electric parts to said body casing, said casing-side fitting unit being formed on said body casing and housing an end portion of said flexible wiring plate,
   wherein a conductive portion formed on an end portion of said flexible wiring plate is directly electrically connected to said terminals when said casing-side fitting unit is engaged with said parts-side fitting unit.

2. The electric connection structure of claim 1, wherein said casing-side fitting unit has a fitting hole, and wherein said flexible wiring plate is disposed on an opposite side of said body casing from the side on which said parts-side fitting unit is fitted and said end portion of said flexible wiring plate is disposed in and extends out from said fitting hole on the side of said body casing fitting unit on which said parts-side fitting unit is fitted.

3. The electric connection structure of claim 1, wherein said electric parts include a cross coil type meter in which two coils are wound around the said bobbin so as to cross each other and a pointer fixed to a rotation shaft of a magnet indicates a value corresponding to a rotation angle of the magnet which rotates by an angle corresponding to a difference between magnetic fluxes generated by the respective coils.

4. The electric connection structure of claim 1, wherein said parts-side fitting unit is integral and with said bobbin and said casing-side fitting unit is integral with said body casing.

5. The electric connection structure of claim 1, wherein one of said parts-side fitting unit and said casing-side fitting unit has an engagement projection and the other of said parts-side fitting unit and said casing-side fitting unit has an engagement hole engageable with said engagement projection.

6. The electric connection structure of claim 1, wherein said parts-side fitting unit has insertion holes in which said terminals are inserted and fixed, and each of said terminals has at one end thereof a connection portion to which a terminal of said coil is connected and has at its other end an elastic portion for elastically pressing said conductive portion of said end portion of said flexible wiring plate.

7. An electric connection structure comprising:

a plurality of electric parts including a bobbin having coils wound therearound and a magnet rotatably supported within the bobbin;

a body casing;

a flexible wiring plate disposed at said body casing;

a parts-side fitting unit attached to said bobbin, said parts-side fitting unit accommodating a plurality of terminals electrically connected to said coils;

a casing-side fitting unit, engageable with said parts-side fitting unit, formed on said body casing, said casing-side fitting unit housing an end portion of said flexible wiring plate;

wherein a conductive portion formed on an end portion of said flexible wiring plate is directly connected to said terminals when said casing-side fitting unit is engaged with said parts-side fitting unit;

wherein said casing-side fitting unit has a fitting hole, and wherein said flexible wiring plate is disposed on an opposite side of said body casing from the side on which said parts-side fitting unit is fitted and said end portion of said flexible wiring plate is disposed in and extends out from said fitting hole on the side of said body casing fitting unit on which said parts-side fitting unit is fitted; and a pressing member, insertable into said fitting hole, for pressing said end portion of said flexible wiring plate to an inner wall of said fitting hole.

8. The electric connection structure of claim 7, wherein said pressing member includes a bottom portion covering said fitting hole on the opposite side of said body casing on which said parts-side fitting unit is fitted and a pressing portion and a fixing portion erected from the bottom portion.

9. The electric connection structure of claim 8, wherein said pressing portion presses the end portion of said flexible wiring plate.

10. The electric connection structure of claim 8, wherein said pressing portion has an outwardly curved shape, and wherein one side wall of said fitting hole has a curved shape for receiving said curved surface of said pressing portion.

11. The electric connection structure of claim 8, wherein said fixing portion has an engagement pawl, for engaging with a top end edge of one side wall of said fitting hole formed at an end portion of said fixing portion.

12. An electric connection structure, comprising:

a plurality of electric parts including a bobbin having coils wound therearound and a magnet rotatably supported within the bobbin;

a body casing;

a flexible wiring plate disposed at said body casing;

a plurality of parts-side fitting units attached to said bobbin, each said parts-side fitting unit accommodating at least one terminal electrically connected to an associated one of said coils; and a plurality of casing-side fitting units, directly engagable with said parts-side fitting units for securely mounting said electric parts to said body casing, formed on said body casing, each said casing-side fitting unit housing an end portion of said flexible wiring plate, wherein a conductive portion formed on each said end portion of said flexible wiring plate is directly electrically connected to said terminals when said casing-side fitting units are engaged with said parts-side fitting units.

* * * * *